United States Patent
Sun

[19]

[11] Patent Number: 5,899,742
[45] Date of Patent: May 4, 1999

[54] MANUFACTURING METHOD FOR SELF-ALIGNED LOCAL INTERCONNECTS AND CONTACTS SIMULTANEOUSLY

[76] Inventor: Shih-Wei Sun, 5F, No. 33, Alley 26, Lane 300, Jen-Ai Rd., Sec. 4, Taipei City, Taiwan

[21] Appl. No.: 09/035,347

[22] Filed: Mar. 5, 1998

[30] Foreign Application Priority Data

Dec. 22, 1997 [TW] Taiwan .................................. 86119492

[51] Int. Cl.$^6$ .................................................. H01L 21/44
[52] U.S. Cl. ........................ 438/682; 438/233; 438/637; 438/630; 438/649; 148/DIG. 19
[58] Field of Search .................................. 438/233, 637, 438/629, 630, 682, 649, FOR 196, FOR 360; 148/DIG. 19

[56] References Cited

U.S. PATENT DOCUMENTS

| | | | |
|---|---|---|---|
| 5,668,065 | 9/1997 | Lin | 438/303 |
| 5,674,781 | 10/1997 | Huang et al. | 437/192 |
| 5,759,889 | 6/1998 | Sakao | 438/241 |
| 5,807,779 | 9/1998 | Liaw | 438/279 |

*Primary Examiner*—Peter Toby Brown
*Assistant Examiner*—Long Pham
*Attorney, Agent, or Firm*—Knobbe, Martens, Olson & Bear LLP

[57] ABSTRACT

The invention provides a novel method, in which self-aligned, borderless contacts and local interconnections of semiconductor devices are manufactured in an integral process. The method is compatible with the LOGIC self-aligned titanium silicide (SALICIDE) and N+/P+ poly dual gate process modules. That is, this invention provides a self-aligned local-interconnect and contact (SALIC) method for a logic technology to forming the self-aligned, borderless contacts, and local interconnects (LI) simultaneously.

12 Claims, 6 Drawing Sheets

MANUFACTURING METHOD FOR SELF-ALIGNED LOCAL INTERCONNECTS AND CONTACTS SIMULTANEOUSLY

CROSS-REFERENCE TO RELATED APPLICATION

This application claims the priority benefit of Taiwan application Ser. No. 86119492, filed Dec. 22, 1997, the full disclosure of which is incorporated herein by reference.

BACKGROUND OF THE INVENTION

1. Field of the Invention

This invention relates to a manufacturing method of semiconductor, and more particularly, to self-aligned local interconnect and contact (SALIC) technology, which integrates a process of self-aligned and borderless contacts as well as a process of local interconnects.

2. Description of Related Art

When integration of elements in integrated circuits (IC) increases, a resistance of source/drain regions in the elements of metal oxide semiconductor (MOS) transistors simultaneously increases. As the resistance of the source/drain region is almost the same as the resistance of a channel of the MOS transistor, a process of self-aligned silicide (SALICIDE) is employed for reducing the sheet resistance of the source/drain regions in order to keep an integral of shallow junctions between the metal layer and the MOS transistor. The salicide process is currently applied in a manufacturing process of very large scale integration (VLSI) device.

Furthermore, a dual gate, such as a $N^+/P^+$ poly dual gate, is employed in the element in deep submicron process when a demand for increasing the density of integrated circuits and decreasing the size of the elements is necessary. For a better performance, a tungsten silicide ($WSi_x$) layer is used for covering the doped poly gate layer of elements, as the same time a poly silicide gate is formed by defining the tungsten suicide layer and the poly gate layer.

FIGS. 1A–1D are shown a conventional manufacturing process of self-aligned silicide. Referring to FIG. 1A, at first, there is a silicon substrate 10 which includes shallow trench isolation regions 11, a gate oxide layer 12a, and a poly gate layer 13a. The shallow trench isolation region 11 is formed by a plurality of steps. At first, shallow trenches are formed in the substrate 10. Then the shallow trenches are filled with, for example, silicon dioxide. Finally, the shallow trench isolation region 11 is formed by an anisotropic dry etching method. An active area 9 for a transistor element is sequentially formed beside every two shallow trench isolation regions 11.

Furthermore, the gate oxide layer 12a is made of, for example, silicon dioxide. The poly gate layer 13a is formed by, for example, a method of low pressure chemical vapor. The thickness of the poly gate layer 13a is about 2000 Å~3500 Å.

Referring to FIG. 1B, the poly gate layer 13a is covered by a tungsten silicide layer 14a. The tungsten suicide layer 14a can be formed by a process of low pressure chemical vapor deposition (LPCVD), in which the reaction is performed by, for example, a mixed gas of tungsten hexafluoride ($WF_6$) and silane at a temperature of about 300° C.~400° C. The thickness of the tungsten silicide layer 14a is about 400 Å~800 Å. Next, a silicon nitride layer 15a is formed by depositing over the tungsten silicide layer 14a. The method of forming the silicon nitride layer 15a is, for example, a method of low pressure chemical vapor deposition.

Referring to FIG. 1C, a structure of gate electrode 13' is then formed above the substrate 10 by a conventional method of photolithography and etching, by which the gate oxide layer 12a, the poly gate layer 13a, the tungsten silicide layer 14a and the silicon nitride 15a are defined. The gate electrode 13' includes a gate oxide 12b, a poly gate layer 13b, a tungsten suicide layer 14b and a silicon nitride 15b.

Referring to FIG. 1D, a spacer 16 is formed around the sidewall of the gate electrode 13'. Then, the self-aligned silicide 17 is formed on a portion of the surface of the substrate 10. The self-aligned suicide 17 can be formed by steps of, at first, forming a titanium layer by sputtering over the sillicon 10. Next, the silicide 17 is formed in the interface of the titanium layer and the exposed parts of the substrate 10 by a method of, for example, a rapid thermal oxidation.

On the other hand, when the integration of the semiconductor device increases, the surface of the chip can not provide enough areas for interconnections inside the device. For catching up with increasing demands for interconnections inside, interconnections of more than two metal layers are currently employed in designs of integrated circuits, especially in complex IC products, e.g., a microprocessor. Even four or five metal layers are designed for interconnections of the elements in the microprocessor.

Referring to FIG.2A~2D, shown a conventional manufacturing process of local interconnects in local areas in the device. Referring to FIG. 2A, it shows a substrate 20, wherein the substrate 20 has a shallow trench isolation area 21 for defining the memory cells. Further, the substrate 20 is covered by a gate oxide layer 22, a first gate electrode 23 and a second gate electrode 24 formed above the gate oxide layer 22, and spacers 25 formed around the sidewalls of the first gate electrode 23 and the second gate electrode 24. The first gate electrode 23 and the second gate electrode 24 are made of, for example, polysilicon doped with impurities. The spacer 25 is made of, for example, silicon dioxide.

Referring to FIG. 2B, next, a process of forming self-aligned silicide (SALICIDE) is employed. Before employing the salicide process, the exposed portion of the gate oxide layer 22 is eliminated. The process includes steps of, for example, at first a metal layer is deposited over the first gate electrode 23, second gate electrode 23, and a gate oxide layer 22. The metal layer is, for example, a titanium layer deposited by magnetron DC sputtering. The thickness of the metal layer is preferably about 200~1000 Å. Next, the titanium layer reacts with surface of the first gate electrode 23, the second gate electrode 24 and the exposed portion of the substrate 20 to produce the silicide 26 at a high temperature. The silicide is, for example, titanium silicide ($TiSi_2$).

Referring to 2C, a titanium nitride layer 27a is deposited by reactive sputtering deposition over the substrate 20 to cover the first gate electrode 23, the second electrode 24, and the spacer 25. The method of reactive sputtering deposition uses the titanium as a metal target. Ions sputtered by bombard react with the nitrogen of the plasma in a circumstance filled with argon and nitrogen to produce titanium nitride (TiN). Then a photoresist layer 28 is formed over the substrate 20, wherein the photoresist layer 28 is defined to cover parts of the substrate 20. For example, referring to FIG. 2C, the portion of the titanium nitride layer 27a located on the surface of the first gate electrode 23 and half of the second gate electrode 24 is exposed.

Referring to FIG. 2D, the exposed titanium nitride 27a uncovered by the photoresist layer 28 is etched off and the residual titanium nitride layer 27b is formed. Next, in the following manufacturing process, the fore-end process of the local interconnect is performed by eliminating the photoresist layer 28. The back-end process can be easily performed by persons skilled in the art in order to complete the device.

Whereas, it is critical for a LOGIC technology to provide the self-aligned, borderless contacts, and local interconnects (LI) simultaneously. In the mean time, it has to be compatible with the LOGIC self-aligned titanium silicide (SALICIDE) and N+/P+ poly dual gate process modules. In the conventional manufacturing process, it has not been accomplished due to difficulties in integrating the salicide process and the LI into the logic salicide and N+/ P+ poly baseline process.

SUMMARY OF THE INVENTION

It is therefore an objective of the present invention to provide a method, in which self-aligned, borderless contacts and local interconnections of semiconductor devices are manufactured in an integral process.

It is therefore another objective of the present invention to provide a method, in which is compatible with the LOGIC self-aligned titanium silicide (SALICIDE) and N+/P+ poly dual gate process modules. That is, this invention provides a self-aligned local-interconnect and contact (SALIC) method for a logic technology to forming the self-aligned, borderless contacts, and local interconnect (LI) simultaneously.

In accordance with the foregoing and other objectives of the present invention, a manufacturing method for self-aligned, borderless contacts and local interconnections. The method comprises providing a substrate, wherein the substrate having a plurality of shallow trench isolation layers, the shallow trench isolation layers used for defining at least a local interconnect area and an active area.

Next, a first gate electrode and a second gate electrode are respectively formed on the local interconnect area and the active area. The first gate electrode and the second gate electrode respectively have a gate oxide layer, a polysilicon layer above the gate oxide layer, a silicide layer, and a first isolation layer.

Next, a plurality of source/drain regions are formed in the substrate by ion implantation using the first gate electrode and the second gate electrode as masks. A first spacer and a second spacer are formed around the first gate electrode and the second gate electrode. Then, a portion of the first gate electrode and a portion of the first spacer are etched off to expose a portion of the silicide layer of the first gate electrode. Next, the exposed portion of the gate oxide layer is eliminated.

Next, self-aligned suicide layer is formed on the exposed surface of the source/drain region. Then, a second isolation layer and a dielectric layer are formed over the second isolation layer. The second isolation layer and the dielectric layer have a first opening above the local interconnect area and a second opening above the active area. The first opening is used for exposing portions of the first gate electrode, the silicide layer, the first spacer, and the self-aligned silicide layer on the surface of the source/drain region around the first electrode. The second opening is used for exposing portions of the second gate electrode, the second spacer, and the self-aligned silicide layer on the surface of the source/drain region aroung the second electrode.

By the above-described method, self-aligned bordless contacts and local interconnections of semiconductor devices are manufactured in a integral process. The method is compatible with the LOGIC self-aligned titanium silicide (SALICIDE) and N+/P+ poly dual gate process modules. That is, this invention provides a self-aligned local-interconnect and contact (SALIC) method for a logic technology to forming the self-aligned, borderless contacts, and local interconnect (LI) simultaneously.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a novel method, in which self-aligned, bordless contacts and local interconnections of semiconductor devices are manufactured in a integral process. The method is compatible with the LOGIC self-aligned titanium silicide(SALICIDE) and N+/P+ poly dual gate process modules. That is, this invention provides a self-aligned local-interconnect and contact (SALIC) method for a logic technology to forming the self-aligned, borderless contacts, and local interconnect (LI) simultaneously.

Figure 1A:
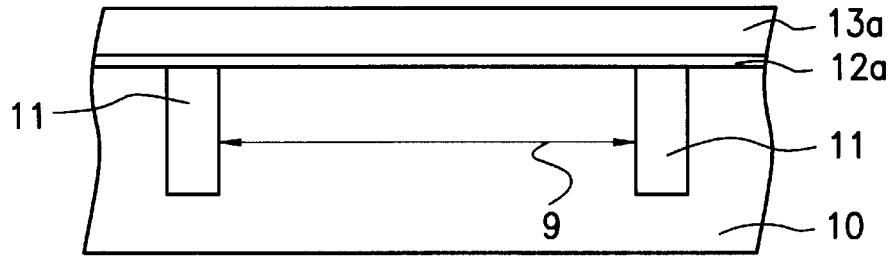
FIGS. 1A–1D show cross-sectional views depicted from selected process stages of a conventional procedure used in the fabrication of self-aligned silicide.
Figure 1B:
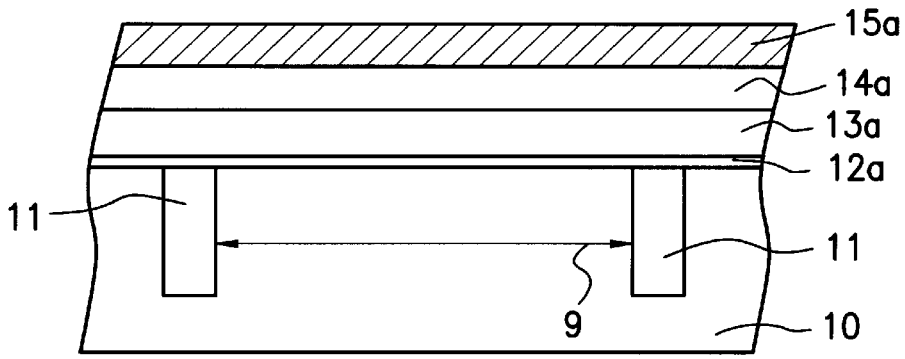
Figure 1C:
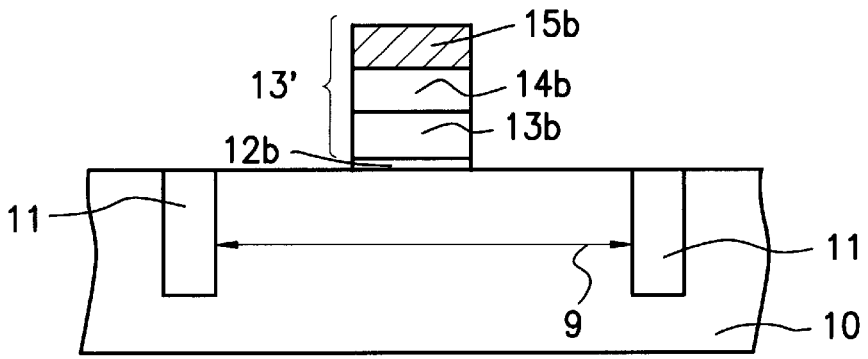
Figure 1D:
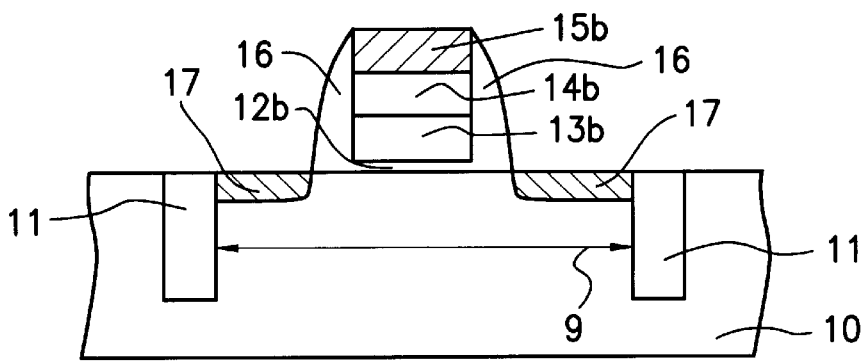
Figure 2A:
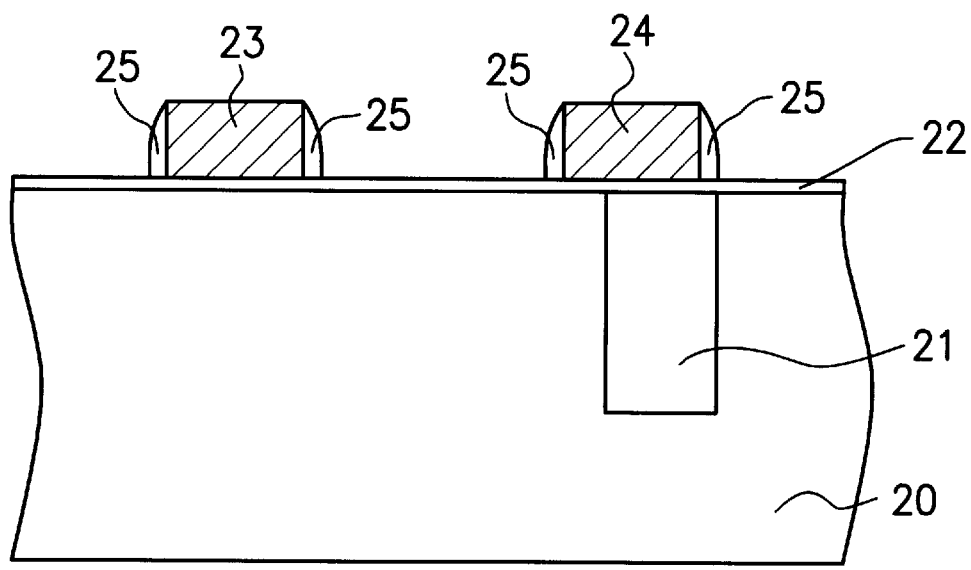
FIGS. 2A–2D show cross-sectional views depicted from selected process stages of a conventional procedure used in the fabrication of local interconnects.
Figure 2B:
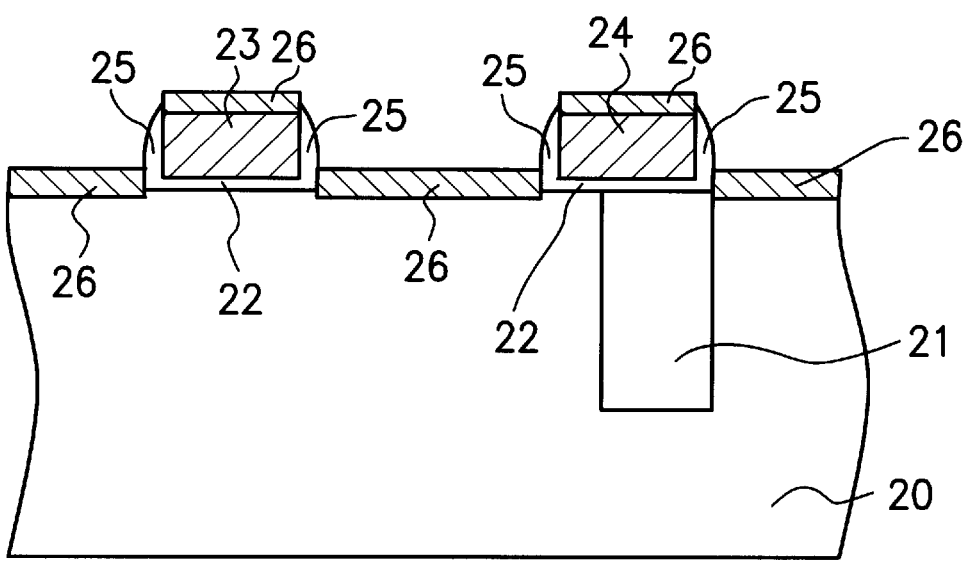
Figure 2C:
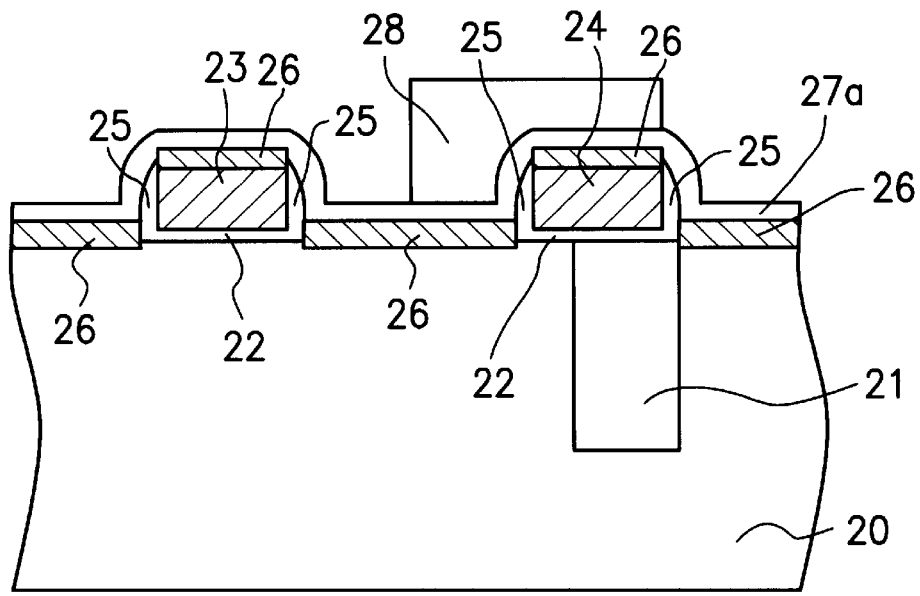
Figure 2D:
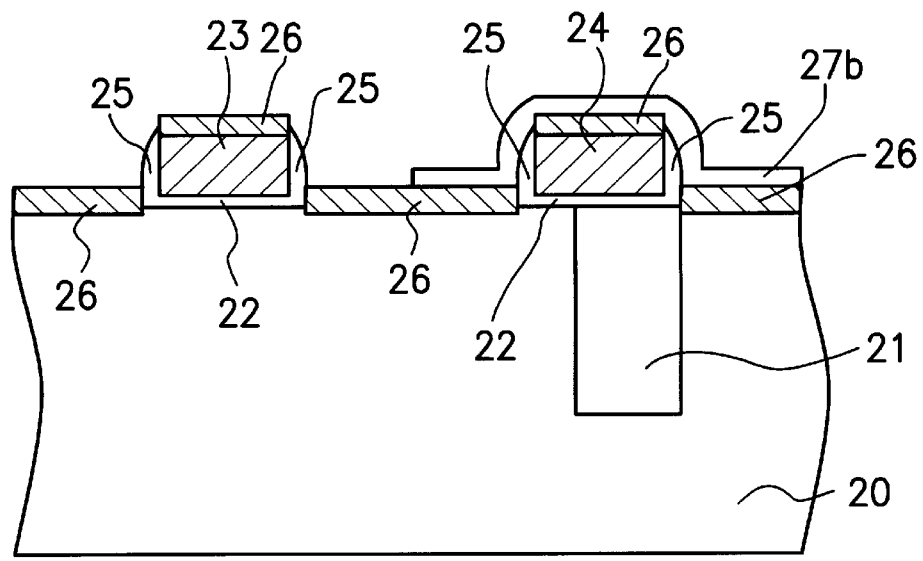
Figure 3A:
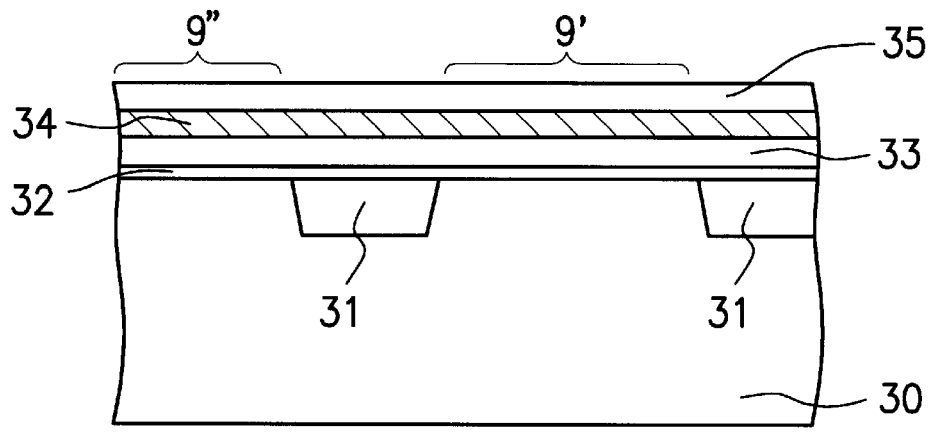
FIG. 3A–3H show cross-sectional views depicted from selected process stages of a procedure in accordance with a preferred embodiment of the invention.

Referring to FIG. 3A–3H, it shows cross-sectional views depicted from selected process stages of a procedure in accordance with a preferred embodiment of the invention, in which a method for self-aligned local interconnect and contact (SALIC) technology is introduced. Referring to FIG. 3A, it shows a substrate 30 and shallow trench isolation areas 31 are formed therein. The shallow trench isolation areas 31 are filled with, for example, silicon dioxide ($SiO_2$). Active areas and local interconnect areas of the semiconductor device are defined between the shallow trench isolation areas 31, e.g., the active area 9' and the local interconnect area 9" as shown in FIG. 3A. Next, a gate oxide layer 32, a polysilicon layer, e.g., a N+/P+ poly dual gate layer 33, a silicide layer, e.g., a $TiSi_2$ layer 34, and a isolation layer, e.g., a silicon nitride layer 35 are sequentially formed above the substrate 30.

Figure 3B:
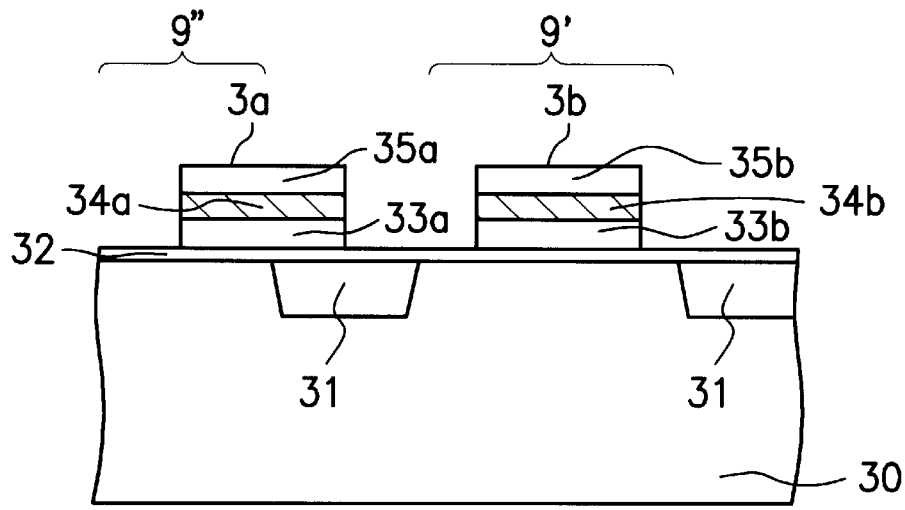

Referring to FIG. 3B, the stacked structure of the N+/P+ poly dual gate layer 33, $TiSi_2$ layer 34, and the silicon nitride layer 35 are defined by a conventional photolithography and etching process to form gate electrodes, for example, a first gate electrode 3a above the local interconnect area 9" and the second gate electrode 3b above the active area 9'. The first gate electrode 3a includes a N+/P+ dual gate layer 33a, a $TiSi_2$ layer 34a, a silicon nitride layer 35a. The second gate electrode 3b includes a N+/P+ dual gate layer 33b, a $TiSi_2$ layer 34b, a silicon nitride layer 35b. The first gate electrode 3a and the second gate electrode 3b are respectively regarded as the gate structures for simultaneously forming the local interconnections and for the self-aligned silicide in different areas in the same device.

Figure 3C:
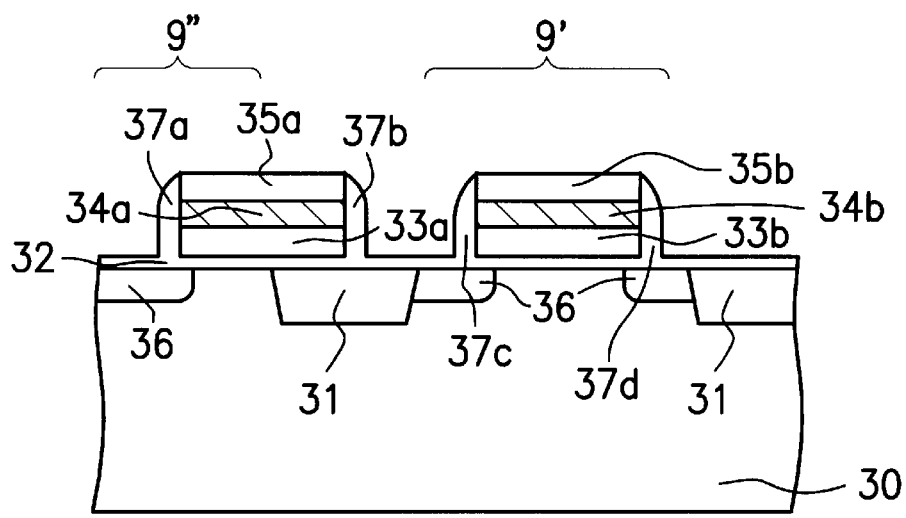

Referring to FIG. 3C, source/drain regions 36 are formed in the substrate 30 beside regions beneath the first gate electrode 3a and the second gate electrode 3b by ions implantation. Next, spacers are formed around the sidewall of gate electrodes. As shown in FIG. 3C, a first spacers 37a and 37b, a second spacers 37c and 37d are respectively formed around the first gate electrode 3a and the second gate electrode 3b. The spacer 37a, 37b and 37c, 37d are made by, for example, silicon nitride.

Figure 3D:
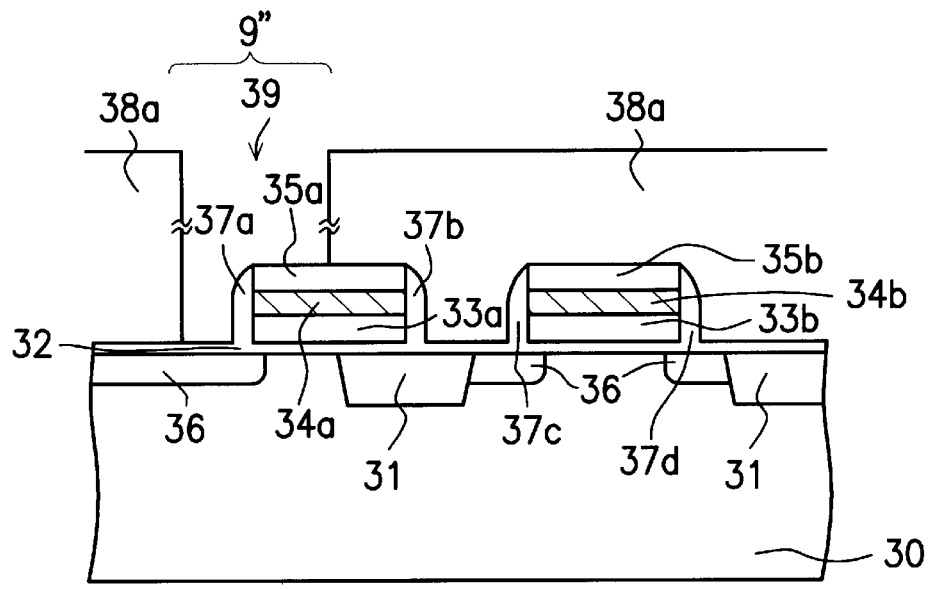

Referring to FIG. 3D, a photoresist layer 38a is formed over the substrate 30. The photoresist layer 38a includes a first opening 39, wherein the first opening exposes a portion of about half surface of the silicon nitride layer 35a, the spacer 37a, and a portion of the gate oxide layer 32. The opening 39 exposes a portion of the local interconnect area 9" and is used for explaining the forming process of the local interconnections in the device.

Figure 3E:
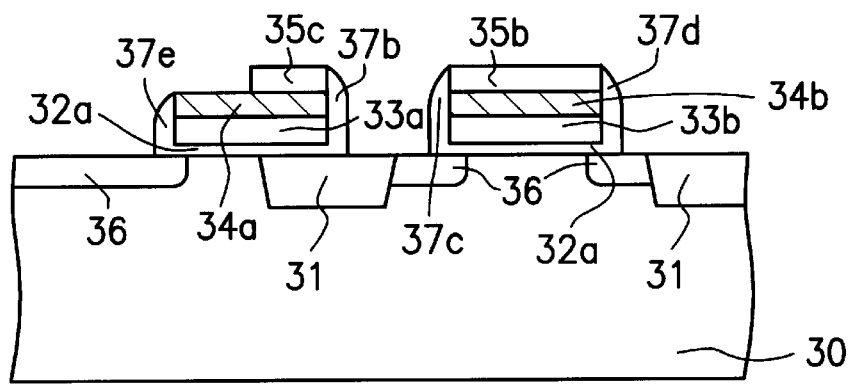

Next, the exposed silicon nitride layer 35a and the horizontal portion of the exposed spacer 37a beside the silicon nitride layer 35a are etched off by, for example, an anisotropic etching using the gate oxide layer 32 as an etching stop layer and using the $TiSi_2$ layer 34a as an etching end point. As shown in FIG. 3E, a silicon nitride 35c and the spacer 37e are formed by the above-described etching process. Then, the photoresist layer 38a is removed. The exposed portion of the gate oxide layer 32 are eliminated by, for example, a wet etching method to form a gate oxide layer 32a.

Figure 3F:
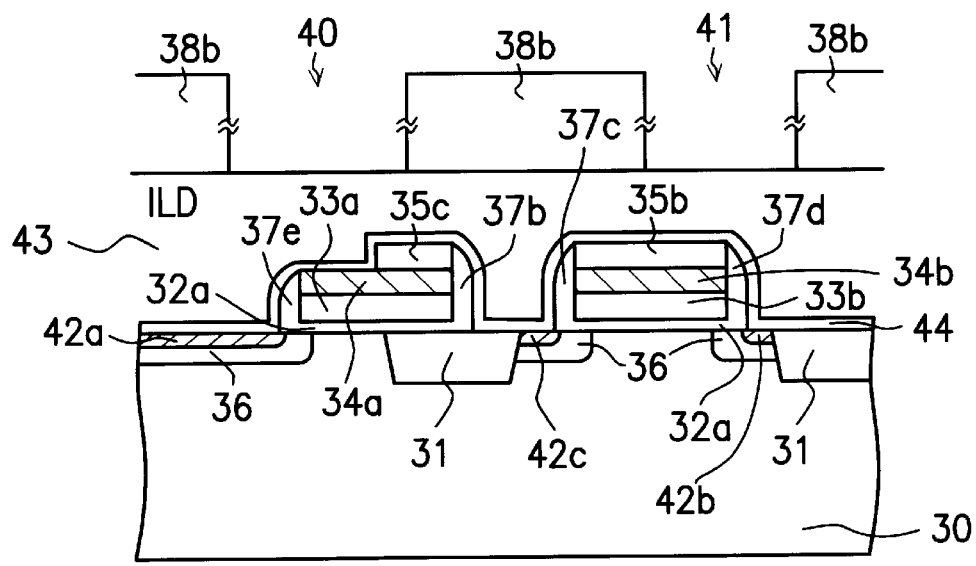

Referring to FIG. 3F, next, a conventional process of forming the self-aligned silicide is employed to form the silicide 42a, 42b and 42c are formed in the surface of the source/drain regions. The silicide 42a, 42b and 42c are made by, for example, $TiSi_2$. Then, a second isolating layer is deposited over the substrate 30, e.g., a silicon nitride layer 44 are formed over the substrate 30. The silicon nitride layer 44 is used as a barrier layer to prevent the device from damages caused by the plasma used in the following process.

Next, a inter-layer dielectric (ILD) layer 43 is formed over the substrate 30 in order to cover the silicon nitride layer 44. Then a photoresist layer 38b is formed over the ILD layer 43. The photoresist layer 38b includes a second opening 40 and a third opening 41. The second opening 40 and the third opening 41 are respectively located above the active area and the local interconnect area.

Figure 3G:
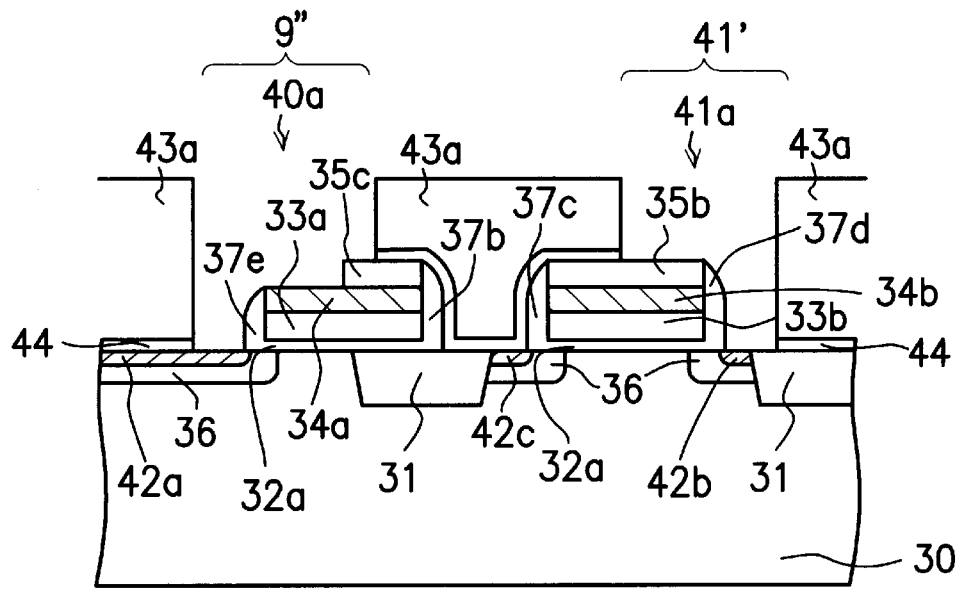

Referring to FIG. 3G, the entire ILD layer 43 above the substrate 30 is changed into an ILD layer 43a by etching off the exposed ILD layer 43 using the silicon nitride layer 44 as a etching stop layer. The ILD layer 43a includes an opening 40a and an opening 41a. The opening 40a therefore exposes a portion of the silicon nitride layer 35c, a portion of the $TiSi_2$ layer 34a, the spacer 37e, and a portion of the silicide 42a. The opening 41a therefore exposes a borderless contact area 41'. The borderless contact area 41' includes a portion of the shallow trench isolation area 31, a portion of the silicon nitride layer 35b, and a portion of the silicide 42b. Then, the photoresist layer 38b is removed.

According to the above-described, the opening 40a is used for forming the local interconnections, and the opening 41a is used for forming the self-aligned and borderless contact.

Figure 3H:
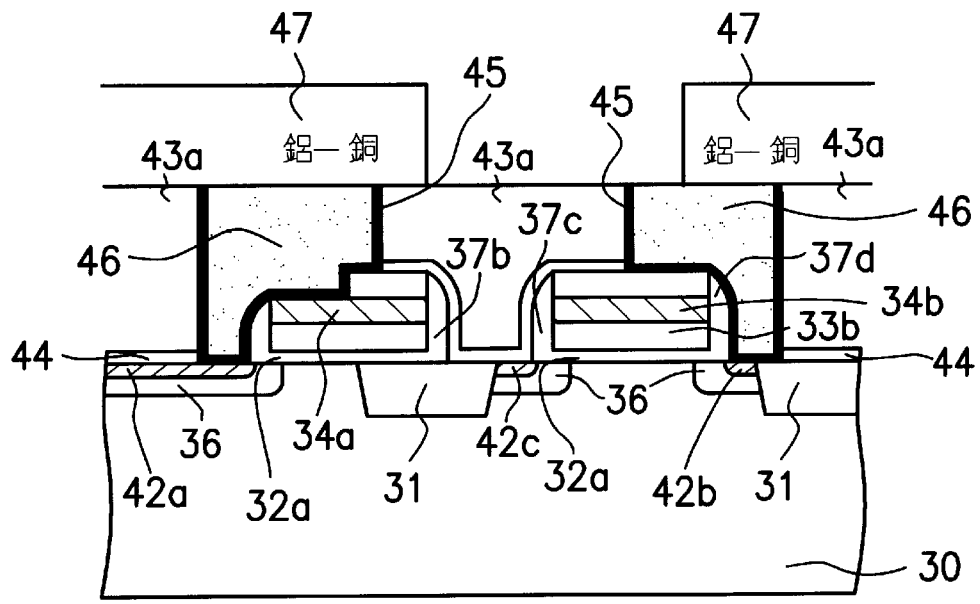

Referring to FIG. 3H, a barrier/glue layer 45 is deposited over the substrate 30. The exposed portions, i.e., exposed portions of the silicon nitride layer 35c, the $TiSi_2$ layer 34a, the spacer 37e and the silicide 42a in the opening 40a, and portions of the shallow trench isolation area 31, the silicon nitride layer 35b, and the silicide 42b in the opening 41a are covered the barrier/Glue layer 45. The sidewalls of the opening 40a and the opening 41a are also covered the barrier/glue layer 45. The barrier/glue layer 45 is made by, for example, titanium and titanium nitride.

Next, a blanket tungsten layer 46 are formed over the substrate 30 to fill the openings 40a and 41a of the ILD layer 43a in order to cover the barrier/glue layer 45. The blanket tungsten layer 46 is formed by, for example, chemical vapor deposition. A chemical mechanical polishing (CMP) is performed to planarize the barrier/glue layer 45, the tungsten layer 46, and the ILD layer 43a. A alloy layer, for example, a Al—Cu layer 47 is formed over the substrate 30, i.e., over the ILD layer 43a and the tungsten layer 46 in order to forming the multi-interconnections in the device. The following process for the device can be performed by a conventional method.

According to the above-described preferred embodiment, this invention provides a novel method, in which self-aligned, bordless contacts and local interconnections of semiconductor devices are manufactured in an integral process.

By using the process of this invention, there are some desired advantages generated. For example, because the method is compatible with the LOGIC self-aligned titanium silicide(SALICIDE) and N+/P+ poly dual gate process modules, the self-aligned local-interconnect and contact (SALIC) method for a logic technology to form the self-aligned, borderless contacts, and local interconnect (LI) simultaneously, and then it decreases the consumption of manufacturing time, and also it promotes the efficiency of the manufacturing.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A manufacturing method for self-aligned, borderless contacts and local interconnections, comprising:

providing a substrate, wherein the substrate having a plurality of shallow trench isolation layers, the shallow trench isolation layers used for defining at least a local interconnect area and an active area;

forming a first gate electrode and a second gate electrode respectively on the local interconnect area and the active area, wherein the first gate electrode and the second gate electrode respectively having a gate oxide layer, a polysilicon layer above the gate oxide layer, a silicide layer, and a first isolation layer;

forming a plurality of source/drain regions in the substrate by ion implantation using the first gate electrode and the second gate electrode as masks;

forming a first spacer and a second spacer respectively around the first gate electrode and the second gate electrode;

etching a portion of the first gate electrode and a portion of the first spacer to expose a portion of the silicide layer of the first gate electrode;

removing the exposed portion of the gate oxide layer;

forming a self-aligned silicide layer on the surface of the source/drain region; and forming a second isolation layer and a dielectric layer over the shallow trench isolation layers, wherein the second isolation layer and the dielectric layer having a first opening above the local interconnect area and a second opening above the active area, wherein the first opening is used for exposing portions of the first gate electrode, the silicide layer, the first spacer, and the self-aligned silicide layer on the surface of the source/drain region around the first electrode, and the second opening is used for exposing portions of the second gate electrode, the second spacer, and the self-aligned silicide layer on the surface of the source/drain region around the second electrode, whereby the self-aligned, borderless contact and local interconnection are formed thereon.

2. The method according to claim 1, wherein further comprising:

forming a barrier/glue layer on sidewalls and bottoms of the first opening and the second opening; and forming a plug layer over the substrate to fill the first opening and the second opening.

3. The method according to claim 2, wherein the barrier/glue layer is a Ti/TiN layer.

4. The method according to claim 3, wherein the Ti/TiN layer is formed by depositing.

5. The method according to claim 4, wherein the plug layer is tugnsten.

6. The method according to claim 1, wherein the silicide layer is $TiSi_2$.

7. The method according to claim 6, wherein the silicide layer is formed by depositing.

8. The method according to claim 1, wherein the first isolation layer and the second isolation layer is silicon dioxide.

9. The method according to claim 1, wherein the first spacer and the second spacer is silicon nitride.

10. The method according to claim 1, wherein removing the gate oxide layer is by a method of wet etching.

11. The method according to claim 1, wherein forming the self-aligned silicide comprising:

forming a metal layer over the substrate;

reacting the metal layer with the exposed surface of the source/drain region at a predetermined temperature to product the self-aligned suicide.

12. A manufacturing method for self-aligned, borderless contacts and local interconnections, comprising:

providing a substrate, wherein the substrate having a plurality of shallow trench isolation areas, the shallow trench isolation layers used for defining at least a local interconnect area and an active area;

forming a first gate electrode and a second gate electrode respectively on the local interconnect area and the active area, wherein the first gate electrode and the second gate electrode respectively having a gate oxide layer, a polysilicon layer above the gate oxide layer, a silicide layer, and a first isolation layer;

forming a plurality of source/drain regions in the substrate by ion implantation using the first gate electrode and the second gate electrode as masks;

forming a first spacer and a second spacer respectively around the first gate electrode and the second gate electrode;

etching a portion of the first gate electrode and a portion of the first spacer to expose a portion of the silicide layer of the first gate electrode;

removing the exposed portion of the gate oxide layer;

forming a self-aligned silicide layer on the surface of the source/drain region;

forming a second isolation layer and a dielectric layer over the shallow trench isolation layers, wherein the second isolation layer and the dielectric layer having a first opening above the local interconnect area and a second opening above the active area, wherein the first opening is used for exposing portions of the first gate electrode, the silicide layer, the first spacer, and the self-aligned suicide layer on the surface of the source/drain region around the first electrode, and the second opening is used for exposing portions of the second gate electrode, the second spacer, and the self-aligned silicide layer on the surface of the source/drain region aroung the second electrode;

forming a barrier/glue layer on sidewalls and bottoms of the first opening and the second opening; and forming a plug layer over the substrate to fill the first opening and the second opening.

* * * * *